(12) United States Patent
Cashman et al.

(10) Patent No.: US 8,581,624 B2
(45) Date of Patent: Nov. 12, 2013

(54) INTEGRATED CIRCUITS WITH MULTI-STAGE LOGIC REGIONS

(75) Inventors: David Cashman, Toronto (CA); David Lewis, Toronto (CA); Valavan Manohararajah, Scarborough (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/434,847

(22) Filed: Mar. 29, 2012

(65) Prior Publication Data

US 2013/0257476 A1    Oct. 3, 2013

(51) Int. Cl.
*H03K 19/173*    (2006.01)

(52) U.S. Cl.
USPC .................................. 326/38; 326/40; 326/41

(58) Field of Classification Search
USPC ......................................................... 326/37–41
See application file for complete search history.

(56) References Cited

U.S. PATENT DOCUMENTS

| | | | |
|---|---|---|---|
| 6,075,380 A * | 6/2000 | Lane ................................ | 326/40 |
| 6,747,480 B1 | 6/2004 | Kaptanoglu | |
| 6,873,182 B2 | 3/2005 | Mohan | |
| 7,218,139 B1 * | 5/2007 | Young et al. ...................... | 326/38 |
| 7,295,035 B1 * | 11/2007 | Agrawal et al. .................. | 326/38 |
| 7,312,632 B2 * | 12/2007 | Lewis et al. ...................... | 326/38 |
| 7,330,052 B2 | 2/2008 | Kaptanoglu | |
| 7,453,286 B1 * | 11/2008 | Carrillo et al. ................... | 326/38 |
| 7,459,932 B1 | 12/2008 | Lewis | |
| 7,558,812 B1 * | 7/2009 | Padalia et al. ................... | 708/235 |
| 7,733,124 B1 * | 6/2010 | Duwel et al. ..................... | 326/40 |
| 7,768,430 B1 * | 8/2010 | Pan et al. ........................ | 341/106 |
| 7,890,910 B1 | 2/2011 | Hutton | |
| 2003/0001615 A1 * | 1/2003 | Sueyoshi et al. ................. | 326/41 |
| 2003/0234667 A1 * | 12/2003 | Digari et al. ..................... | 326/39 |
| 2005/0140389 A1 * | 6/2005 | Gliese et al. ..................... | 326/41 |
| 2006/0097752 A1 * | 5/2006 | Bhatti et al. ..................... | 326/40 |
| 2006/0164119 A1 * | 7/2006 | Nowak-Leijten ............... | 326/41 |

OTHER PUBLICATIONS

Altera Inc., FLEX 10K Embedded Programmable Logic Device Family, Jan. 2003 (128 pages).
Anderson et al., "Area-efficient FPGA logic elements: architecture and synthesis," IEEE/ACM Asia and South Pacific Design Automation Conference (ASP-DAC), pp. 369-375, Yokohama, Japan, Jan. 2011 (7 pages).

* cited by examiner

*Primary Examiner* — Vibol Tan
(74) *Attorney, Agent, or Firm* — Treyz Law Group; Chih-Yun Wu

(57) ABSTRACT

A programmable logic region on a programmable integrated circuit may include a first set of look-up tables that receive programmable logic region input signals and a second set of look-up tables that produce programmable logic region output signals. Multiplexer circuitry may be interposed between the first and second sets of look-up tables. The multiplexer circuitry may receive the programmable logic region input signals in parallel with the output signals from the first set of look-up tables and may provide corresponding selected signals to the second set of look-up tables. The programmable logic region input signals may be shared by the first and second sets of look-up tables. Logic circuitry may be coupled to outputs of the first and second sets of look-up tables. The logic circuitry may be configured to logically combine output signals from the first and second sets of look-up tables.

19 Claims, 10 Drawing Sheets

INTEGRATED CIRCUITS WITH MULTI-STAGE LOGIC REGIONS

BACKGROUND

This relates to integrated circuits such as programmable integrated circuits.

Programmable integrated circuits are well known. Programmable integrated circuits can be programmed by a user to implement a desired custom logic function. In a typical scenario, a logic designer uses computer-aided design (CAD) tools to design a custom logic circuit. When the design process is complete, the tools generate configuration data. The configuration data is loaded into programmable elements of the integrated circuit to configure the device to perform the functions of the custom logic circuit. In particular, the configuration data configures programmable interconnects, programmable routing circuits, and programmable logic circuits in the programmable integrated circuits.

Programmable integrated circuits include programmable logic circuits that are configured to receive input signals and perform custom logic functions on the received input signals to produce output signals. Each programmable logic circuit has a predetermined number of inputs and a predetermined number of outputs. Input and output signals for each logic circuit are routed by interconnects throughout the programmable integrated circuit. The programmable logic circuits typically include look-up tables that receive the input signals and produce the output signals based on configuration data that is provided to the look-up tables.

A programmable integrated circuit is configured to perform a given custom logic function by mapping the logic function onto one or more programmable logic circuits so that the programmable logic circuits collectively perform the custom logic function. It may be difficult to efficiently utilize resources such as programmable logic circuits when configuring a programmable integrated circuit to perform the custom logic function. For example, a custom logic function for producing a single output signal using two input signals may be mapped onto a programmable logic circuit that has four inputs and one output. In this scenario, only two of the four inputs may be used to perform the custom logic function, thereby resulting in inefficient use of circuitry in the programmable logic circuit that is associated with the two unused inputs.

SUMMARY

An integrated circuit such as a programmable integrated circuit may include programmable logic regions that receive programmable logic region input signals at respective inputs and produce programmable logic region output signals at respective outputs. The programmable logic region input signals may be routed from other circuitry on the integrated circuits to the programmable logic regions over interconnects and the programmable logic region output signals may be routed by the interconnects from the programmable logic regions throughout the integrated circuit.

A programmable logic region may include look-up tables that receive static data output signals from corresponding programmable elements and select output signals from the static data output signals based on the programmable logic region input signals of the programmable logic region. The programmable logic region may include a first set of look-up tables that receive the programmable logic region input signals and a second set of look-up tables that produce the programmable logic region output signals. The first and second sets of look-up tables may be referred to as first and second processing stages. Multiplexer circuitry may be interposed between the first and second sets of look-up tables.

The multiplexer circuitry may receive the programmable logic region input signals in parallel with the output signals from the first set of look-up tables and may provide corresponding selected signals to the second set of look-up tables. The output signals from the first set of look-up tables may be provided by the programmable logic region as additional programmable logic region output signals (e.g., the programmable logic region may provide output signals from the first and second sets of look-up tables to interconnects for routing to other logic on the integrated circuit). The multiplexer circuitry may be configured in a cascade configuration in which output signals from the first set of look-up tables are provided to the second set of look-up tables. If desired, the multiplexer circuitry may be configured in other configurations in which programmable logic region input signals are provided to the second set of look-up tables (e.g., configurations in which the first and second sets of look-up tables operate independently).

Some of the inputs at which the programmable logic region receives programmable logic region input signals (e.g., from interconnects) may be shared by the first and second sets of look-up tables. For example, one of the inputs may be coupled to a first look-up table of the first set and a second look-up table of the second set. In this scenario, programmable logic region input signals that are received at the input may be provided to the first and second look-up tables in parallel.

Logic circuitry may be coupled to outputs of the first and second sets of look-up tables. The logic circuitry may be configured to logically combine output signals from the first and second sets of look-up tables (e.g., by programming associated programmable elements to provide desired static output signals to the logic circuitry during normal operation of the integrated circuit). The logic circuitry may be operable in a first configuration in which the output signals from the first and second sets of look-up tables are passed to programmable logic region outputs. The logic circuitry may be operable in a second configuration in which output signals from the first and/or second sets of look-up tables are modified based on output signals from the second set of look-up tables.

Further features of the invention, its nature and various advantages will be more apparent from the accompanying drawings and the following detailed description of the preferred embodiments.

DETAILED DESCRIPTION

The present invention relates to programmable integrated circuits. The programmable integrated circuits may include programmable logic regions, programmable interconnects, and programmable routing circuitry.

Figure 1:
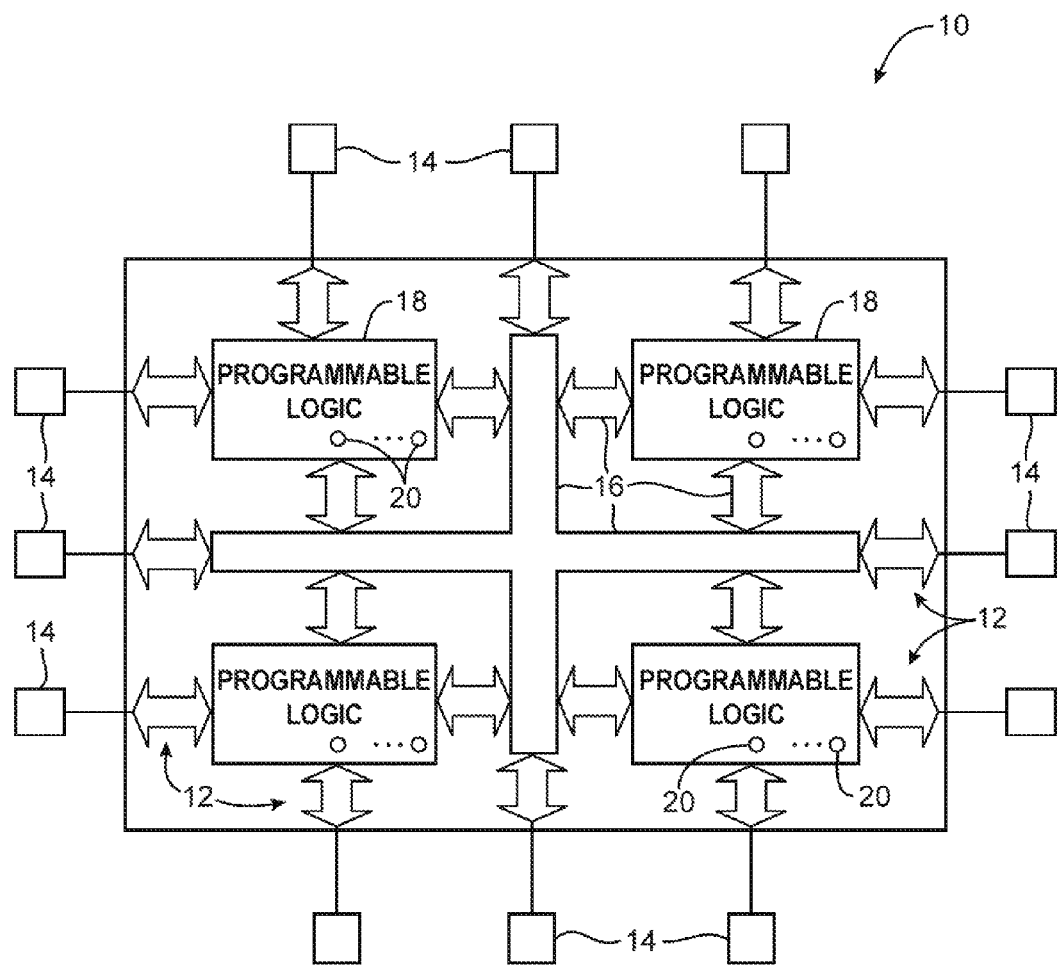
FIG. 1 is an illustrative diagram of a programmable integrated circuit with programmable logic regions in accordance with an embodiment of the present invention.

FIG. 1 is a diagram of an illustrative programmable integrated circuit device. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Interconnection resources 16 may sometimes be referred to herein as interconnects (e.g., interconnects formed from combinations of fixed interconnects and programmable interconnects).

Interconnects 16 may be used to interconnect regions of programmable logic such as programmable logic regions 18. Programmable logic regions 18 may sometimes be referred to as logic array blocks or programmable circuit regions. Programmable logic regions 18, may, if desired, contain groups of smaller logic regions (e.g., sub-regions). These smaller logic regions, which may sometimes be referred to as logic elements or adaptive logic modules, may be interconnected using local interconnection resources.

Programmable logic regions 18 contain programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable logic regions 18 may include combinational and sequential logic circuitry. For example, programmable logic regions 18 may include look-up tables, registers, logic gates, and multiplexers. Programmable elements 20 may be used to provide static control output signals for controlling the state of associated logic circuitry in programmable logic 18 during normal operation. For example, programmable elements 20 may be loaded with configuration data before normal operation of device 10. In this scenario, programmable elements 20 may provide the static control output signals to programmable circuitry of device 10 during normal operation of the programmable circuitry. The output signals generated by elements 20 are typically applied to gates of metal-oxide-semiconductor (MOS) transistors (sometimes referred to as pass gate transistors). In some scenarios, programmable elements 20 may be used to provide static data output signals to logic components such as look-up tables that select from the static data output signals based on control signals that are received by the look-up tables (e.g., static and/or dynamic control signals).

The circuitry of device 10 may be organized using any suitable architecture. As an example, logic region 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
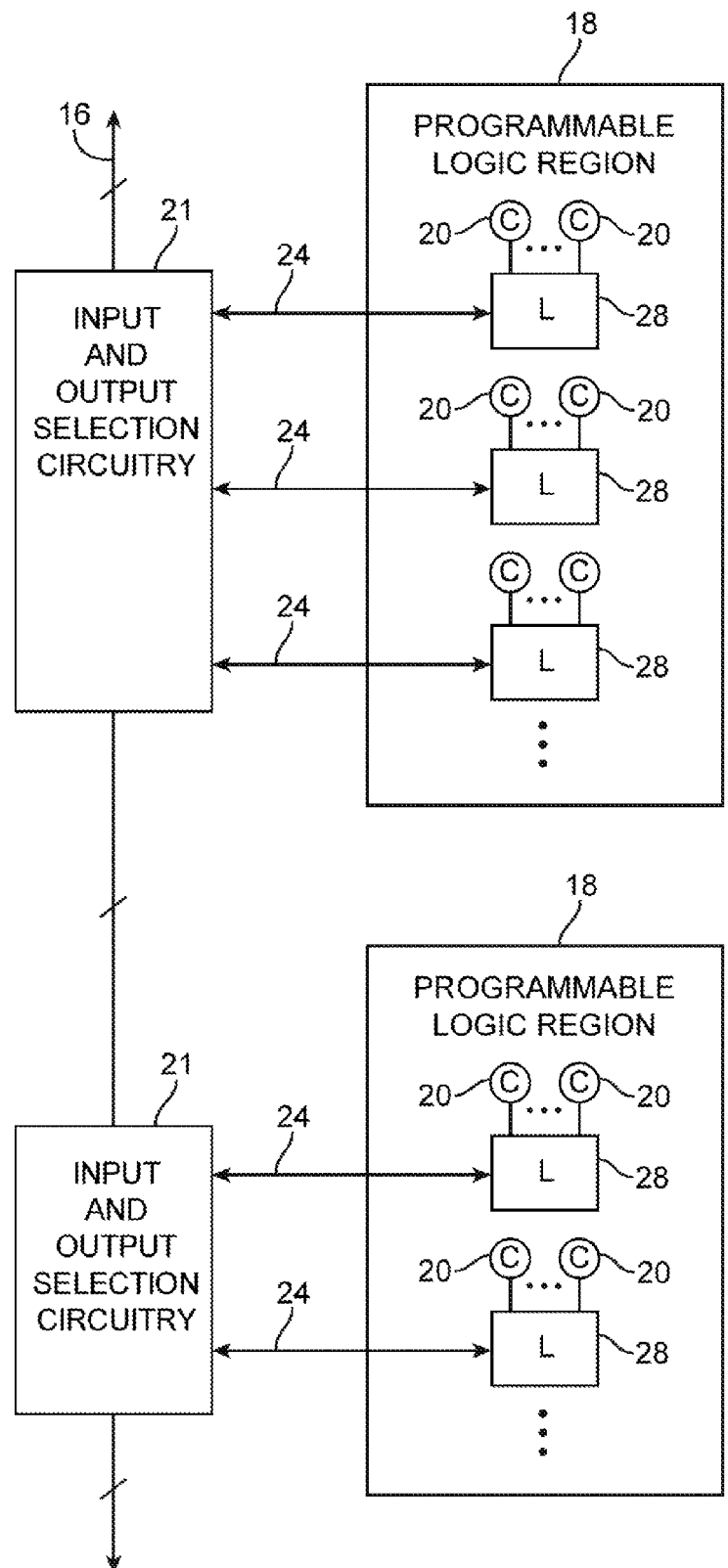
FIG. 2 is an illustrative diagram of programmable logic regions each having programmable logic sub-regions configured to receive and drive signals onto interconnects in accordance with an embodiment of the present invention.

Programmable logic regions 18 may include programmable logic sub-regions that can be independently configured to produce respective outputs. Each programmable logic regions 18 may include any desired number of programmable logic sub-regions (e.g., two, three, four, eight, or more). The programmable logic sub-regions may sometimes be referred to as logic elements, adaptive logic modules, or programmable logic cells. FIG. 2 is a diagram of programmable logic regions 18 having programmable logic sub-regions 28. Each programmable logic region 18 may have associated input and output selection circuitry 21. Circuitry 21 may be configured to route selected input signals from interconnects 16 to sub-regions 28 of programmable logic regions 18. Programmable logic sub-regions 28 may receive the selected input signals via local routing paths 24 and produce output signals that may be provided to input and output selection circuitry 21 over local routing paths 24. Output selection circuitry 21 may be configured to receive the output signals and drive one or more selected interconnects 16 with the output signals.

Figure 3:
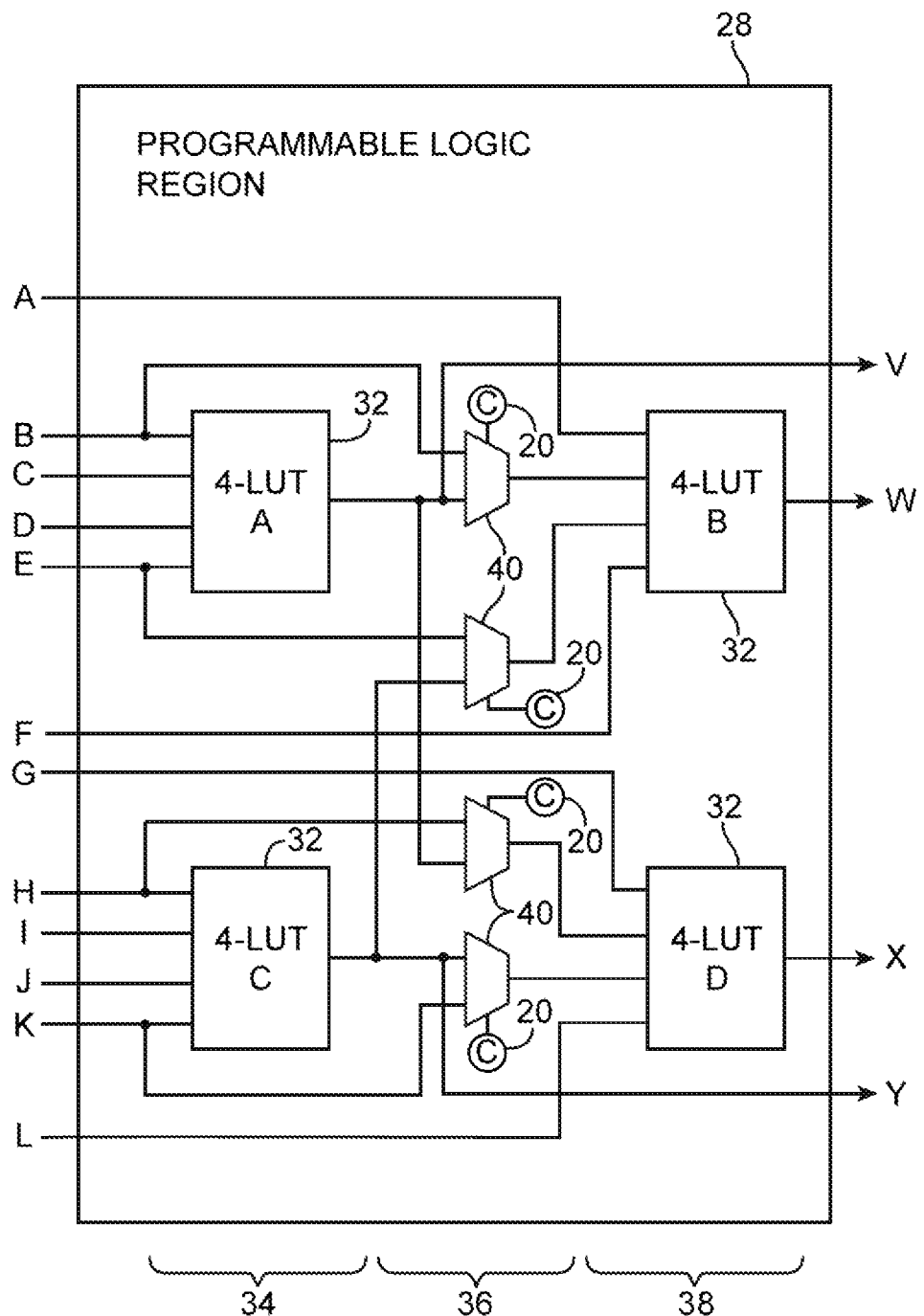
FIG. 3 is an illustrative diagram of a programmable logic region having cascaded processing stages in accordance with an embodiment of the present invention.

Programmable logic regions 18 may be configured to perform custom logic functions by mapping portions of the custom logic functions onto sub-regions 28. Each sub-region 28 may be configured to perform a respective portion of a custom logic function by loading configuration data into programmable elements 20 that are associated with that sub-region. Each sub-region 28 may include resources such as multiplexers, look-up tables, and registers that are configured by programmable elements 20. Programmable logic sub-regions 28 may be provided with cascaded processing stages and selection circuitry for selectively sharing input signals between each processing stage. The cascaded processing stages and selection circuitry may provide improved flexibility (e.g., for implementing custom logic functions using limited circuit resources of sub-region 28). FIG. 3 is an illustrative diagram of a programmable logic region (sub-region) 28 having processing stages 34 and 38 that are cascaded.

As shown in FIG. 3, region 28 may have inputs that receive input signals (e.g., input signals A, B, C, etc.) and may have outputs at which output signals V, W, X, and Y are produced. The output signals may be generated based on the received input signals. Region 28 may include programmable logic circuitry such as look-up table (LUT) circuitry 32 that is operable to receive the input signals and provide output signals selected from static data output signals of associated programmable elements (e.g., programmable elements that have been loaded with configuration data). In the example of FIG. 3, look-up table circuitry 32 may each have four inputs and therefore be referred to as 4-LUTs or 4-input LUTs. For example, 4-LUT A may receive input signals B, C, D, and E and produce output signal V, whereas 4-LUT C may receive input signals H, I, J, and K and produce output signal Y.

Groups of look-up tables 32 may form processing stages 34 and 38. For example, 4-LUT A and 4-LUT C may form processing stage 34 and 4-LUT B and 4-LUT D may form processing stage 38. Region 28 may include a selection stage 36 interposed between processing stages 34 and 38. Selection stage 36 may include multiplexers 40 that select signals from the inputs of region 28 and the outputs of processing stage 34 and provide the selected signals to processing stage 38. For example, a first multiplexer 40 may receive input signal B and output signal V and provide a selected one of input signal B and output signal V to 4-LUT B. As another example, a second multiplexer 40 may provide a selected one of input signal H and output signal V to 4-LUT D. Processing stages 34 and 38 may be referred to as cascaded stages, because one or more of the outputs of processing stage 34 may be provided to the inputs of processing stage 38 (e.g., via selection stage 36).

Figure 4:
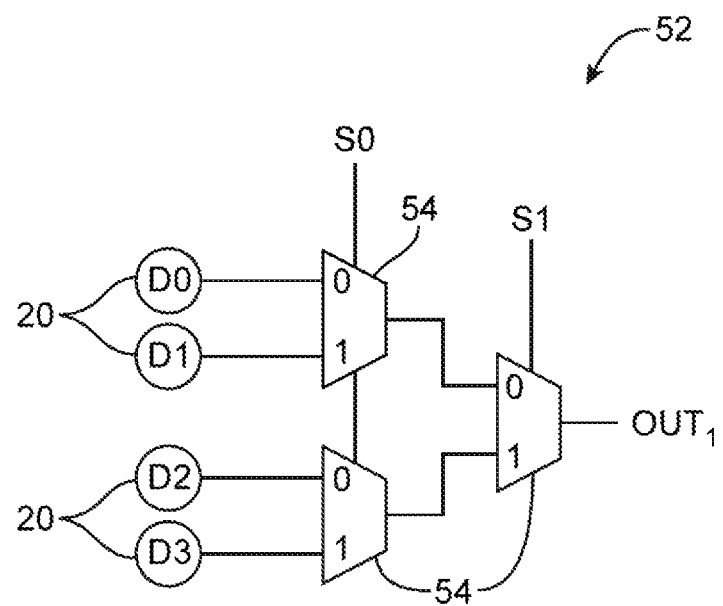
FIG. 4 is an illustrative diagram of look-up table circuitry in accordance with an embodiment of the present invention.

Look-up table circuitry such as look-up table circuitry 32 may be formed from multiplexing circuitry that uses control input signals to produce an output signal selected from configuration data stored in corresponding programmable elements. FIG. 4 is an illustrative look-up table 52 that may be formed from multiplexing circuits 54. Look-up table 52 may receive two control input signals S0 and S1 and therefore may sometimes be referred to as a 2-LUT. Multiplexing circuits 54 may receive input signals S0 and S1 and use the input signals to produce an output signal OUT1 having a value selected from configuration data stored in programmable elements 20. As an example, multiplexing circuits 54 may produce an output signal having a value of D0 when control input signals S0 and S1 are both logic zero, whereas multiplexing circuits 54 may produce an output signal having a value of D2 when control input signal S0 is logic zero and input signal S1 is logic one.

The example of FIG. 4 in which a 2-LUT is formed using four programmable elements 20 and three multiplexers 54 is merely illustrative. If desired, look-up tables having any number of control signals (e.g., 3-LUTs, 4-LUTs, 5-LUTs, etc.) may be formed using additional programmable elements and multiplexers. As an example, 4-LUT A of FIG. 3 may be formed using sixteen programmable elements and fifteen multiplexing circuits (e.g., fifteen two-input multiplexers arranged in four successive stages).

Figure 5:
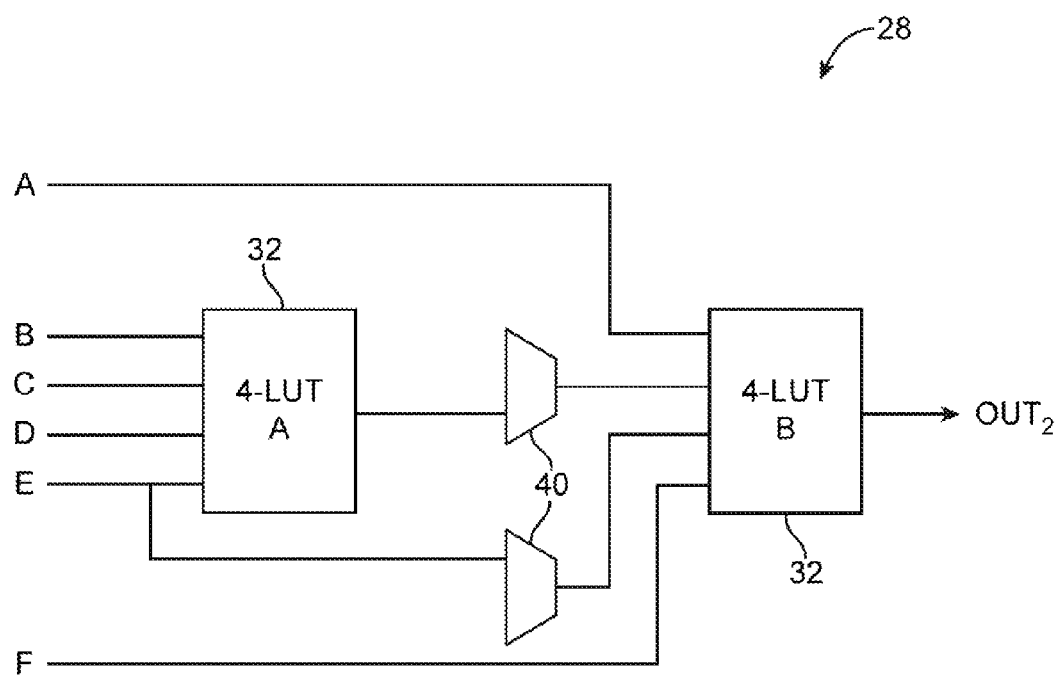
FIG. 5 is an illustrative diagram of a programmable logic region having look-up tables configured as a cascade in accordance with an embodiment of the present invention.

By providing programmable logic region 28 with cascaded processing stages, region 28 may be able to accommodate custom logic functions that require more inputs than provided by any individual logic circuit of region 28 without routing signals through interconnects 16 and input and output selection circuitry 21. FIG. 5 is an illustrative example in which 4-LUT A and 4-LUT B of programmable logic region 28 may be configured as a cascade. In the example of FIG. 5, multiplexers 40 may be configured to route the output of 4-LUT A to 4-LUT B and to route a shared input E to 4-LUT B. For illustrative purposes, circuitry of region 28 that is not used to form the cascade configuration has not been drawn in FIG. 5 (e.g., 4-LUT C and 4-LUT D have not been drawn).

In a cascaded configuration, 4-LUT A and 4-LUT B may be configured to perform selected six-input functions. For example, 4-LUT A and 4-LUT B may be configured to form a four to one multiplexer having six inputs (e.g., four data inputs and two control inputs to select between the four data inputs). In this scenario, input signals A, B, C, D, E, and F may be provided as data input signals and control input signals. For example, 4-LUT A and 4-LUT B may be configured to use input signals E and B as control input signals that control whether input signals C, D, A, or F are selected and provided as output signal OUT2.

By configuring multiplexers 40 to route the output signal of 4-LUT A to 4-LUT B and to route input signal E to 4-LUT B, 4-LUT A and 4-LUT B may be configured to operate independently of other look-up table circuitry in programmable logic region 28. For example, 4-LUT A and 4-LUT B may be configured as a four to one multiplexer that operates independently from 4-LUT C and 4-LUT D (e.g., because the input signals of 4-LUT A and 4-LUT B may be independent of the output signals of 4-LUT C and 4-LUT D).

Figure 6:
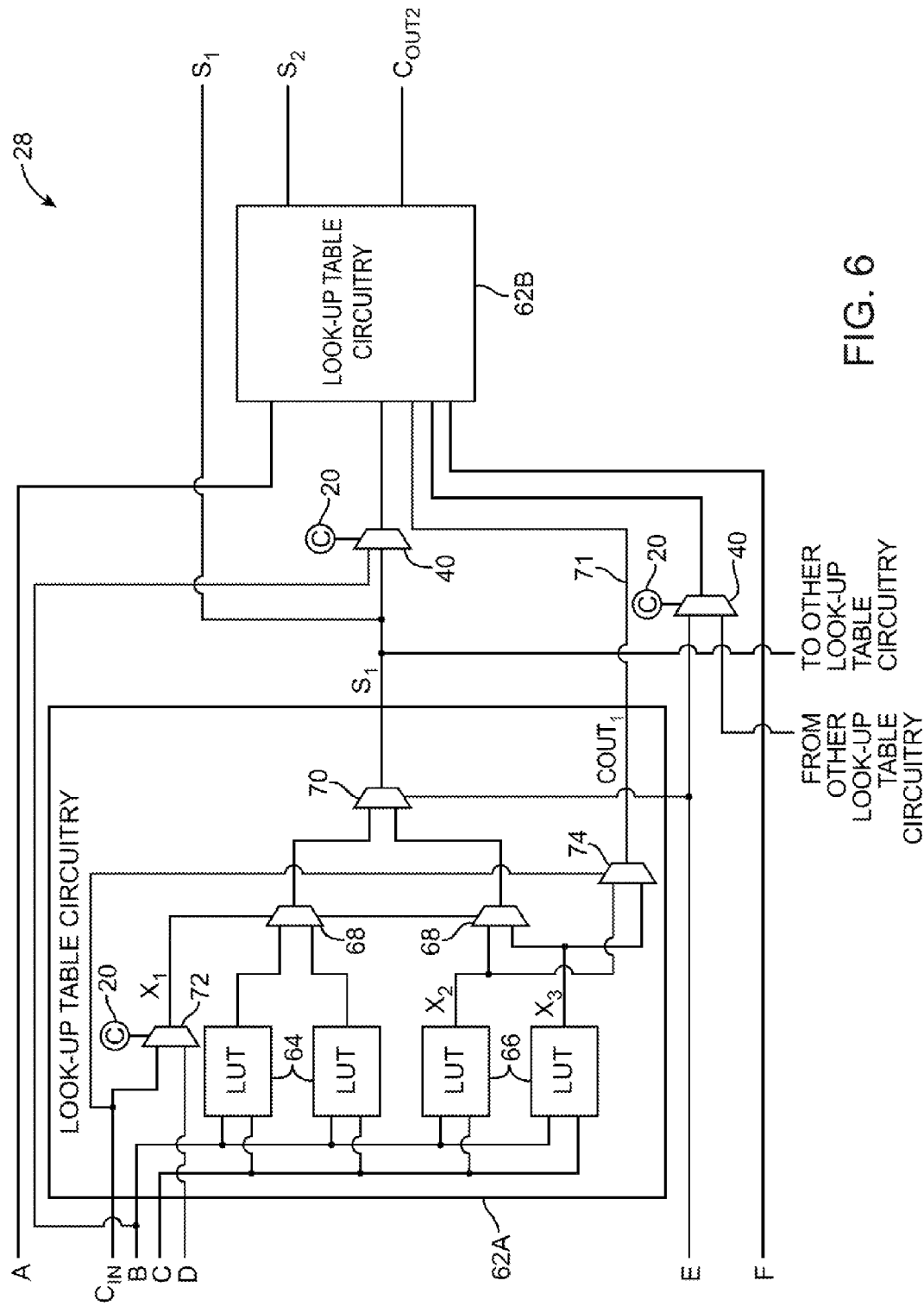
FIG. 6 is an illustrative diagram of a programmable logic region having look-up table circuitry operable to perform full adder functions in accordance with an embodiment of the present invention.

Programmable logic regions such as programmable logic region 28 of FIG. 3 that have cascaded processing stages may be provided with look-up table circuitry that accommodates additional input signals and produces additional output signals. The look-up table circuitry may be configured to perform full adder functions or other desired custom logic functions. FIG. 6 is a diagram showing how programmable logic region 28 may be provided with look-up table circuitry 62 (e.g., circuitry 62A and 62B) that accommodates full adder configurations. Each look-up table circuitry 62 may receive a carry in signal and produce a carry out signal in addition to a sum signal. For example, look-up table circuitry 62A may use input signal CIN to produce a carry out signal COUT1 in addition to output signal S1 whereas circuitry 62B may use carry out signal COUT1 (e.g., as a carry in signal of circuitry 62B) to produce a carry out signal COUT2 in addition to output signal S2. Carry out signal COUT1 may be routed to look-up table circuitry 62B over routing path 71 (e.g., a direct routing path between look-up table circuitry 62A and 62B).

Each look-up table circuitry 62 may include look-up tables (LUTs) 64 and 66. LUTs 64, LUTs 66, multiplexing circuits 68, and multiplexing circuit 70 may form a 4-LUT that is operable to receive signals X1, B, C, and E and produce an output signal S1 based on the received signals. Multiplexing circuit 72 may receive input signals CIN and D and produce intermediate signal X1 selected from input signals CIN and D.

Look-up table circuitry 62A may be provided with multiplexing circuit 74 that receives intermediate output signals produced by LUTs 66 and produces an output signal COUT1 selected from the received intermediate output signals (e.g., circuit 74 may select output signal COUT1 from signals X2 and X3). Output signal COUT1 may be selected based on input signal CIN. Look-up table circuitry 62B may be formed substantially similar to look-up table circuitry 62A so that output signal COUT2 is selected from intermediate signals that are generated by look-up tables.

In normal configurations of look-up table circuitry 62, multiplexing circuit 72 may be configured to route input signal D to the control inputs of multiplexing circuits 68 (e.g., by loading appropriate configuration data into an associated programmable element 20). In other words, multiplexing circuit 72 may select input D to provide as output X1 during the normal configurations. By routing input signal D to multiplexing circuits 68, LUTs 64 and 66 and multiplexing circuits 68 and 70 may be configured to form a 4-LUT that produces output S1 from inputs B, C, D, and E. As an example, during the normal configurations, look-up table circuitry 62A may operate substantially similar to 4-LUT A of FIG. 3 and look-up table circuitry 62B may operate substantially similar to 4-LUT B.

Programmable logic region 28 may be configured in a full-adder configuration that produces sum and carry output signals from input signals A, B, C, D, E, F, and CIN. In the full-adder configuration, circuitry 62A may be configured to perform full-adder functions on input signals B and C to produce sum signal S1 and carry out signal COUT1. Sum signal S1 and carry out signal COUT1 may be determined based on carry-in signal CIN. Multiplexing circuit 72 may be configured to route carry-in signal CIN to multiplexing circuits 68. LUTs 64 may be configured to produce potential sum signals based on input signals B and C and multiplexing 68 may select sum signal S1 from the potential sum signals using carry-in signal CIN. Input signal E may direct multiplexing circuit 70 to route selected sum signal S1 to an output of look-up table circuitry 62A. LUTs 66 and multiplexing circuit 74 may be configured so that carry-out signal COUT1 is generated and routed to an output of look-up table circuitry 62A (e.g., based on carry-in signal CIN and input signals B and C).

Multiplexing circuit 74 may provide look-up table circuitry 62 with improved performance. For example, output signals S2 and COUT2 of look-up table circuitry 62B may be generated based on output signal COUT1 from look-up table circuitry 62A (e.g., during configurations such as the full-adder configuration in which look-up table circuitry 62B is configured to use output signal COUT1 to produce output signals S2 and/or COUT2). In this scenario, output signal S2 and COUT2 may be delayed relative to output signal S1 (e.g., because input signals that are used to generate output signal S1 need only traverse look-up table circuitry 62A, whereas input signals that are used to generate output signals S2 and COUT2 may be required to traverse look-up table circuitry 62A and 62B). In other words, output signals S2 and/or COUT2 may be associated with critical signal paths. Multiplexing circuit 74 may help reduce the delay associated with producing output signals S2 and COUT2 by providing a direct path for input signal CIN to select output signal COUT1 from intermediate signals X2 and X3 (e.g., so that input signal CIN can bypass multiplexing circuit 72).

Carry out signal COUT1 of look-up table circuitry 62A may be routed to look-up table circuitry 62B (e.g., via a direct routing path to a carry input of look-up table circuitry 62B). Look-up table circuitry 62B may be formed and configured substantially similar to look-up table circuitry 62A so that circuitry 62B performs full-adder functions to produce sum signal S2 and carry out signal COUT2 based on carry out signal COUT1 received from circuitry 62A. For example, circuitry 62B may be configured to generate sum signal S2 and carry out signal COUT2 based at least partly on inputs A, F, and carry out signal COUT1. Circuitry 62B may include a first portion of look-up table circuitry operable to be configured to produce sum signal S2 and a second portion of look-up table circuitry operable to be configured to produce carry out signal COUT2.

Look-up table circuitry such as multiplexing circuits 72 and 74 may provide look-up table circuitry 62A and 62B with the capability of producing output signals based on intermediate signals within the look-up table circuitry and based on additional input signals. For example, multiplexing circuit 74 may be used to generate output signal COUT1 based on additional input signal CIN and intermediate signals X2 and X3, whereas multiplexing circuit 72 may be used to produce sum signal S1 based on input signal D or additional input signal CIN.

The example of FIG. 6 in which look-up table circuitry such as circuitry 62A is provided with circuitry 72 and 74 to accommodate full-adder configurations is merely illustrative. If desired, look-up table circuitry 62A and 62B may be provided with any desired circuitry (e.g., multiplexing circuitry, logic circuitry, programmable elements, etc.) to process additional input signals and produce additional output signals. One or more of the output signals from a first look-up table circuitry (e.g., circuitry 62A) may be selectively routed by selection circuitry such as multiplexing circuits 40 to a second look-up table circuitry (e.g., circuitry 62B). If desired, one or more of the output signals from the first look-up table circuitry may be directly routed to a second look-up table circuitry (e.g., to reduce signal delay associated with outputs of the second look-up table).

Programmable logic regions such as programmable logic region 28 may be formed from any desired number of cascaded look-up table circuitry. In some scenarios, interconnect resources that are used to route signals to and from programmable logic regions may be limited. For example, interconnects may occupy a disproportionate amount of area on an integrated circuit relative to the area occupied by programmable logic regions. In this scenario, it may be desirable to reduce the number of input signals that are provided to programmable logic regions, thereby helping to conserve limited interconnect resources.

Figure 7:
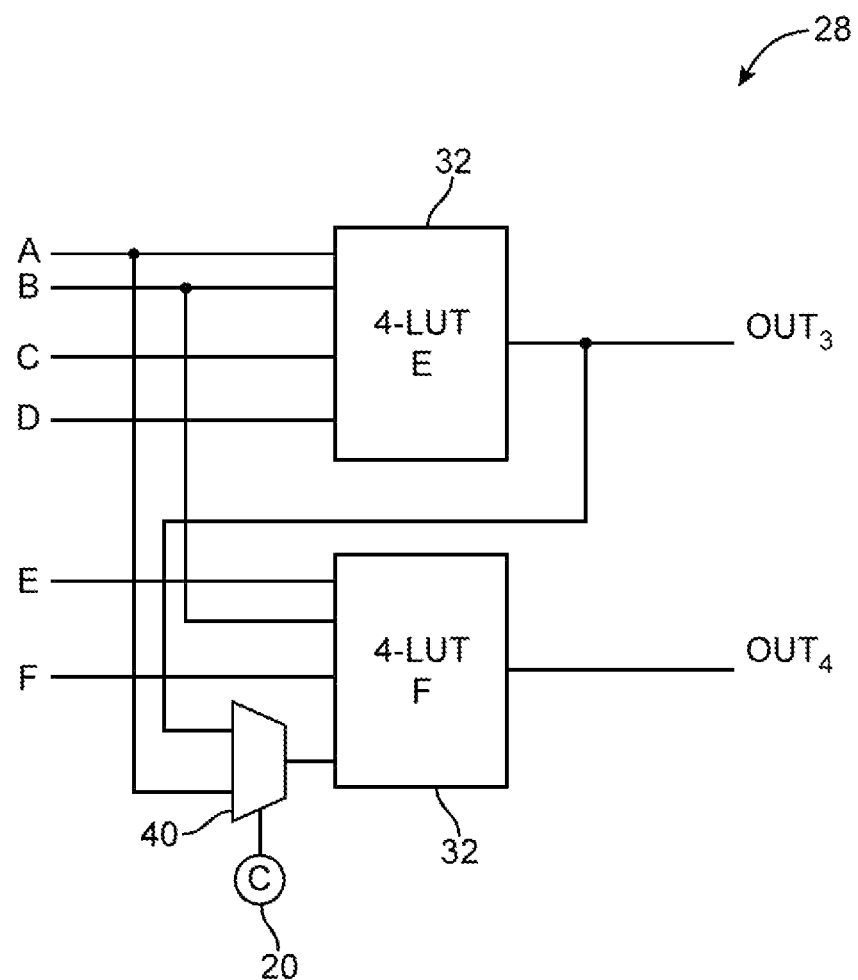
FIG. 7 is an illustrative diagram of a programmable logic region having cascaded look-up tables that share input signals in accordance with an embodiment of the present invention.

In an additional embodiment, two or more of the look-up table circuitry of a programmable logic region may share input signals to reduce the number of input signals that are routed to that programmable logic region. FIG. 7 is an illustrative programmable logic region 28 having cascaded look-up table circuitry 32 that share input signals. As shown in FIG. 7, 4-LUT E is operable to receive input signals A, B, C, and D and produce a corresponding output signal OUT3, whereas 4-LUT F is operable to receive input signals B, E, F, and a selected one of input signal A and output signal OUT3.

Programmable logic region 28 may include a multiplexing circuit 40 that can be configured to select whether output signal OUT3 of 4-LUT E or input signal A is provided to 4-LUT F (e.g., configured by loading configuration data into programmable element 20). Multiplexing circuit 40 may be configured so that 4-LUT E and 4-LUT F operate independently or in a cascaded configuration. For example, multiplexing circuit 40 may be configured so that 4-LUT E and 4-LUT F operate independently by loading configuration data into programmable element 20 that configures multiplexing circuit 40 to route input signal A to 4-LUT F. In this scenario, output signals OUT3 and OUT4 may be produced independently (e.g., output signal OUT4 may not be generated based on output signal OUT3). In other words, programmable logic region 28 may be able to accommodate two different custom user functions each producing one output signal from four input signals.

Programmable logic region 28 may be configured to accommodate custom user functions having more than four input signals by configuring multiplexing circuit 40 to route output signal OUT3 from 4-LUT E to 4-LUT F. In this configuration, 4-LUT F may be configured to produce an output signal OUT4 based on up to six input signals (e.g., because 4-LUT E and 4-LUT F may, in combination, produce output signal OUT4 based on the six input signals).

The number of cascaded look-up table circuitry and the number of input signals used by the cascaded look-up table circuitry is merely illustrative. If desired, programmable logic region 28 may be formed with any desired number of cascaded look-up table circuitry (e.g., two, three, four, or more) that can be configured to produce any desired number of independent output signals or configured to produce output signals based on input signals of two or more of the cascaded look-up table circuitry. If desired, the cascaded look-up table circuitry may each receive any desired number of input signals to produce corresponding output signals.

Figure 8:
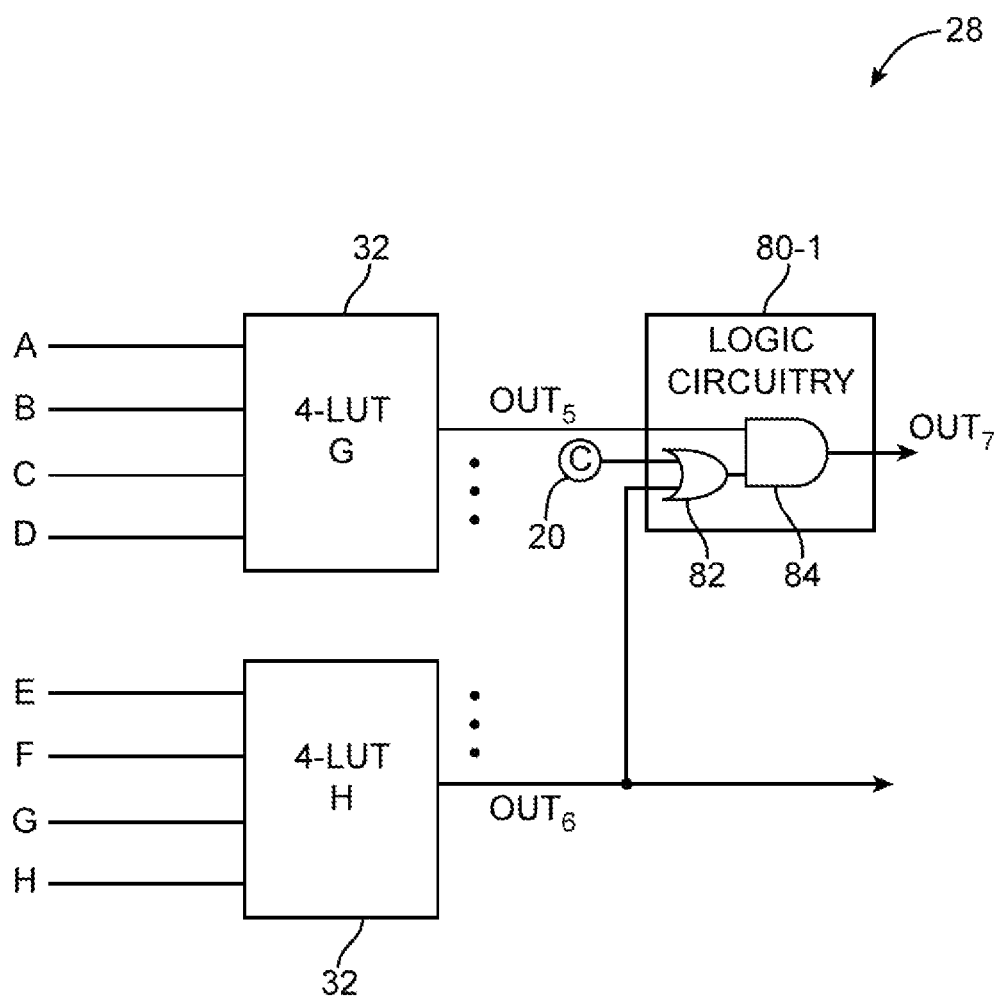
FIG. 8 is an illustrative diagram of a programmable logic region having logic circuitry operable to combine output signals from look-up table circuitry in accordance with an embodiment of the present invention.

In another suitable embodiment, a programmable logic region may be provided with look-up table circuitry and logic circuitry configurable to combine output signals produced by the look-up table circuitry. FIG. 8 is a diagram of an illustrative programmable logic region 28 having 4-LUT G and 4-LUT H that produce respective output signals OUT5 and OUT6. 4-LUT G may be configured to produce output signal OUT5 based on input signals A, B, C, and D whereas 4-LUT H may be configured to produce output signal OUT6 based on input signals E, F, G, and H. Programmable logic region 28 may be provided with logic circuitry 80-1 that receives output signals OUT5 and OUT6 and may be configured via programmable element 20 to produce a corresponding output signal OUT7 based on the received output signals.

Logic circuitry 80-1 may include logic OR gate 82 and logic AND gate 84. Logic circuitry 80-1 may be configured via programmable element 20 in a first configuration in which output signal OUT7 is the same as output signal OUT5 (e.g., in which output signal OUT7 is generated independently from output signal OUT6) or in a second configuration in which output signal OUT7 is dependent on output signals OUT5 and OUT6. In the second configuration, logic circuitry 80-1 may accommodate custom logic functions that require more inputs than provided by 4-LUT G or 4-LUT H while helping to reduce the amount of area occupied by region 28 (e.g., because logic circuitry 80-1 may occupy less area than additional look-up table circuitry).

In the first configuration of logic circuitry 80-1, logic OR gate 82 may be configured via programmable element 20 to pass a logic one value to logic AND gate 84 (e.g., programmable element 20 may be used to store a logic one). Logic OR gate 82 may pass the logic one value received from programmable element 20 regardless of the value of output signal OUT6. In other words, logic OR gate 82 may produce a logic one output whether output signal OUT6 is logic zero or logic one. Logic AND gate 84 may receive the logic one passed by logic OR gate 82 and pass output signal OUT5 as output signal OUT7 (e.g., the value of output signal OUT7 may be the same as the value of output signal OUT5). By configuring logic circuitry 80-1 in the first configuration, programmable logic region 28 may independently produce output signals OUT7 and OUT6 based on respective input signals.

In the second configuration of logic circuitry 80-1, logic OR gate 82 may be configured via programmable element 20 to pass output signal OUT6 to a first data input of logic AND gate 84 (e.g., programmable element 20 may be used to store a logic zero). Logic AND gate 84 may receive output signal OUT6 from logic OR gate 82 at a second data input and perform a logic AND operation on output signals OUT5 and OUT6 to produce output signal OUT7 (e.g., output signal OUT7 may be asserted when output signals OUT5 and OUT6 are both asserted).

By configuring logic circuitry 80-1 in the second configuration, programmable logic region 28 may be configured to produce a first output signal OUT6 based on input signals E, F, G, and H and produce a second output signal OUT7 based on input signals A, B, C, and D, and output signal OUT6. In other words, programmable logic region 28 may be configured to accommodate any desired custom logic function that can be decomposed into performing a logic AND operation using the output of a first sub-function (e.g., the output of 4-LUT G) and the output of a second sub-function (e.g., the output of 4-LUT H). In the second configuration, logic circuitry 80-1 may allow region 28 to accommodate custom logic functions that require more input signals than provided by a single look-up circuitry 32 (e.g., without routing intermediate signals such as OUT5 to other regions 28 through input and output selection circuitry and interconnects such as circuitry 21 and interconnects 16 of FIG. 2).

Figure 9:
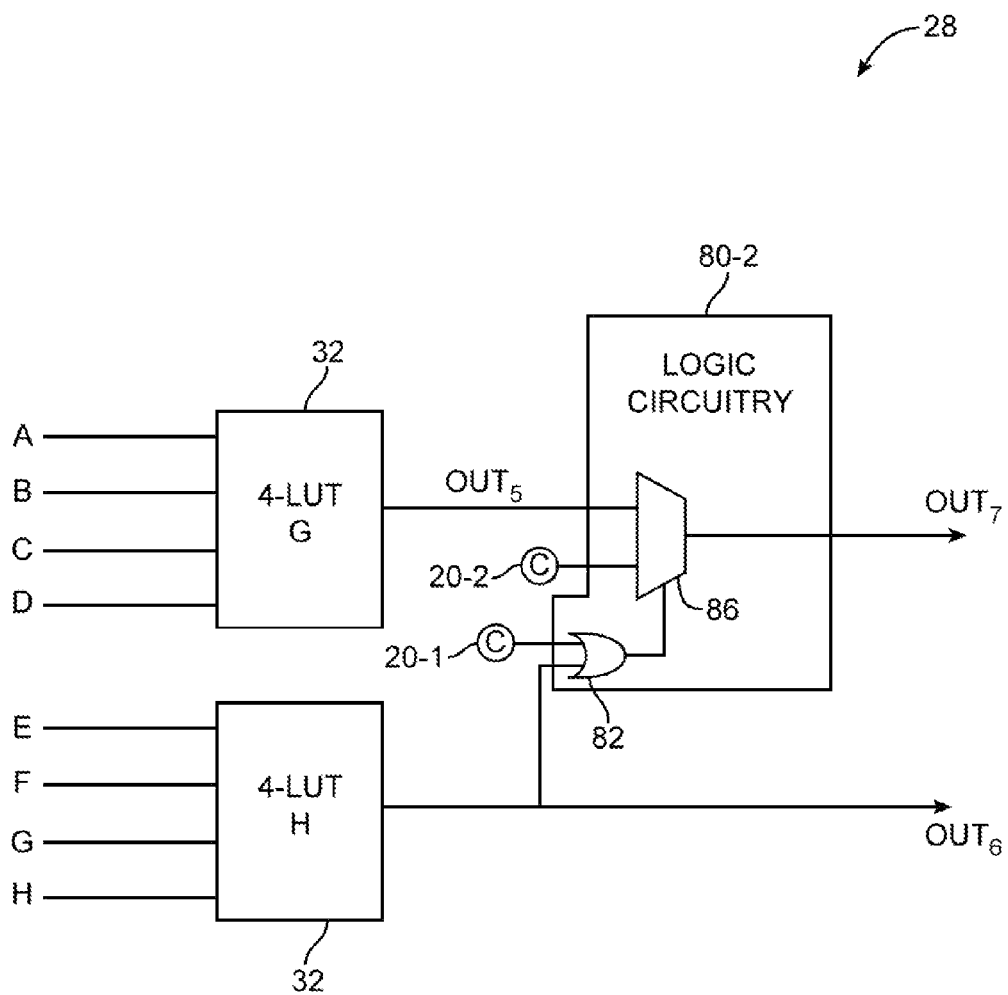
FIG. 9 is an illustrative diagram of a programmable logic region having logic circuitry having multiplexing circuitry operable to combine output signals from look-up table circuitry in accordance with an embodiment of the present invention.

The example of FIG. 8 in which logic circuitry 80-1 is formed with logic OR gate 82 and logic AND gate 84 is merely illustrative. If desired, programmable logic region 28 may be provided with any desired logic circuitry for combining two or more look-up table circuitry output signals. The look-up table circuitry output signals may be received in parallel with programmable logic element output signals at data inputs of logic gates in the logic circuitry. FIG. 9 is an illustrative diagram of programmable logic circuitry 28 having logic circuitry 80-2 with logic OR gate 82 and multiplexer 86.

Programmable logic region 28 may be configured in a logic OR configuration in which logic circuitry 80-2 performs a logic OR operation on output signals OUT5 and OUT6 to produce output signal OUT7 or a logic AND configuration in which logic circuitry 80-2 performs a logic AND operation on output signals OUT5 and OUT6. Logic circuitry 80-2 may be configured in either the logic OR configuration or the logic AND configuration by programming element 20-1 to provide a logic zero value to logic OR gate 82. By providing a logic zero value to logic OR gate 82, output signal OUT6 may be passed by logic OR gate 82 to a control input of multiplexer 86. Multiplexer 86 may then determine the value of output signal OUT7 based on output signal OUT6. For example, if output signal OUT6 is a logic one, multiplexer 86 may pass the value stored in programmable element 20-2 whereas if output signal OUT6 is logic zero, multiplexer 86 may pass output signal OUT5.

As an example, logic circuitry 80-2 may be configured in a logic OR configuration by programming elements 20-1 and 20-2 with logic zero and logic one values, respectively. In the logic OR configuration, multiplexer 86 may produce output signal OUT7 having a value that is logic one when either of output signals OUT5 and OUT6 is logic one. As another example, logic circuitry 80-2 may be configured in a logic AND configuration by programming elements 20-1 and 20-2 with logic zero values and inverting the logic function performed by 4-LUT H (e.g., by inverting logic values that are stored as configuration data in programmable elements associated with 4-LUT H so that the programmable elements produce inverted static data output signals).

Figure 10:
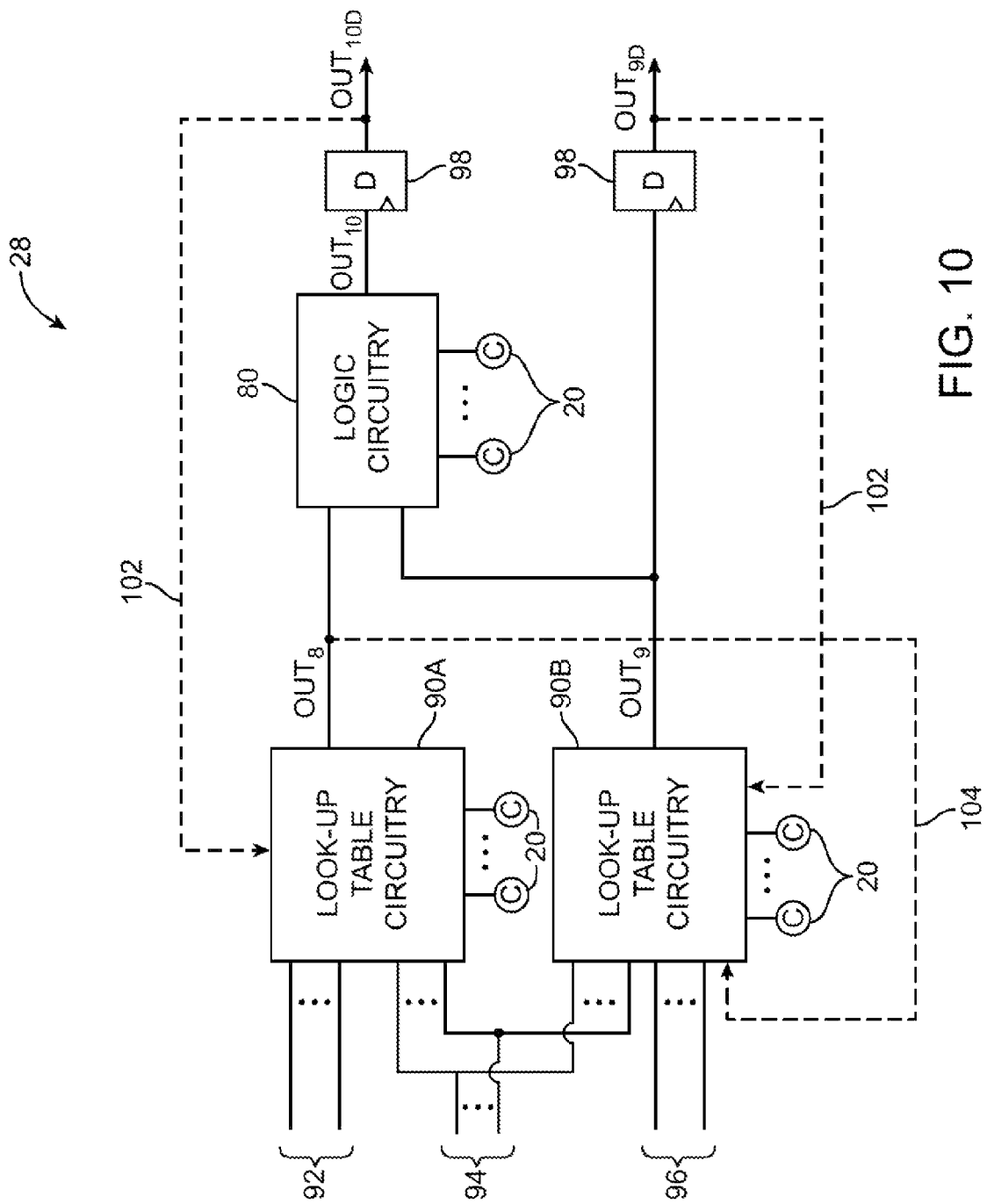
FIG. 10 is an illustrative diagram of a programmable logic region having look-up table circuitry and logic circuitry in accordance with an embodiment of the present invention.

The examples of FIG. 8 and FIG. 9 in which logic circuitry (e.g., circuitry 80-1 or 80-2) is used to combine the outputs of 4-LUT G and 4-LUT H are merely illustrative. If desired, logic circuitry or other combinational logic circuitry may be used to combine any desired number of outputs from look-up table circuitry having any desired number of inputs. FIG. 10 is an illustrative diagram of a programmable logic region 28 having logic circuitry 80 that produces output signal OUT10 by combining output signals OUT8 and OUT8 from look-up table circuitry 90A and 90B.

As shown in FIG. 10, look-up table circuitry 90A and 90B may receive respective input signals 92 and 96. For example, circuitry 90A may receive one or more input signals 92. Look-up table circuitry 90A and 90B may share one or more input signals 94 (e.g., input signals 94 may be received and processed by look-up table circuitry 90A and 90B in parallel).

For example, look-up table circuitry 90A and 90B may share one, two, three or more input signals 94. Look-up table circuitry 90A may be configured (e.g., by programming elements 20) to produce output OUT8 based on input signals 92 and/or shared input signals 94, whereas look-up table circuitry 90A may be configured to produce output OUT5 based on input signals 96 and/or shared input signals 94.

If desired, look-up table circuitry 90A and 90B may be coupled via optional routing path 104. For example, look-up table circuitry 90A and 90B may be configured in a cascade configuration in which output signal OUT8 from look-up table circuitry 90A is routed to look-up table circuitry 90B via optional routing path 104 or in a normal configuration in which output signal OUT9 is produced by look-up table circuitry 90B independently of output signal OUT8.

Logic circuitry 80 may include logic gates such as logic AND gates, logic OR gates, logic NAND gates, logic NOR gates, or other logic gates. The logic gates may be used to perform logic functions on outputs OUT8 and OUT9 to generate output signal OUT10. Logic circuitry 80 may be configured via associated programmable elements 20 to perform different logic functions when combining output signals OUT8 and OUT9 or may be configured to isolate output signal OUT10 from output signal OUT9. Some of the logic gates may receive logic values from programmable elements 20 at inputs of the logic gates and may be configured by programming elements 20 with appropriate values so that the logic gates produce desired output values.

Output signals OUT10 and OUT9 may be stored in storage circuitry 98. Storage circuitry 98 may be a flip-flop, register, or other storage element that stores output signals OUT10 and OUT9 and provides respective delayed output signals OUT10D and OUT9D (e.g., output signals OUT10D and OUT9D may be delayed relative to output signals OUT10 and OUT9 for one or more system clock cycles). Storage circuitry 98 may sometimes be referred to as delay elements, because signals that pass through circuitry 98 may be delayed. If desired, delayed output signals OUT10D and OUT9D may be provided to look-up table circuitry 90A and 90B via feedback paths 102 (e.g., output signal OUT10D may be routed via feedback path 102 to look-up table circuitry 90A without traversing interconnects such as interconnects 16 and input and output selection circuitry such as circuitry 21 of FIG. 2).

Look-up table circuitry 90A and 90B may be configured to produce output signals (e.g., output signals OUT8 and OUT9) based on delayed output signals OUT10D and OUT9D (e.g., output signals that have been produced during previous system clock cycles). In this configuration, delay elements 98 may each form a feedback loop for look-up table circuitry 90A and 90B. For example, delay element 98 and feedback path 102 may form a feedback loop from the output of logic circuitry 80 to an input of look-up table circuitry 90A.

The foregoing is merely illustrative of the principles of this invention and various modifications can be made by those skilled in the art without departing from the scope and spirit of the invention. The foregoing embodiments may be implemented individually or in any combination.

What is claimed is:

1. A programmable logic region on a programmable integrated circuit, comprising:
    a first set of look-up tables operable to receive programmable logic region input signals for the programmable logic region;
    a second set of look-up tables operable to provide programmable logic region output signals for the programmable logic region;
    multiplexer circuitry coupled between the first set of look-up tables and the second set of look-up tables, wherein the multiplexer circuitry is operable to receive the programmable logic region input signals and output signals from the first set of look-up tables and is further operable to provide corresponding selected signals to the second set of look-up tables; and
    a plurality of inputs at which the programmable logic region input signals are received by the programmable logic region, wherein at least one input of the plurality of inputs is coupled in parallel to the first and second sets of look-up tables.

2. The programmable logic region defined in claim 1 further comprising:
    a programmable element operable to provide a static output signal that configures the multiplexer circuitry so that the first and second sets of look-up tables form a cascade configuration in which the output signals from the first set of look-up tables are provided to the second set of look-up tables.

3. The programmable logic region defined in claim 1 further comprising logic circuitry coupled to the first and second set of look-up tables, wherein the logic circuitry is operable to pass the programmable logic region output signals to outputs of the programmable logic region in a first configuration and is further operable to modify the programmable logic region output signals based on the output signals from the first set of look-up tables in a second configuration.

4. The programmable logic region defined in claim 3 wherein the logic circuitry comprises:
    a logic AND gate coupled to the first and second sets of look-up tables; and
    a logic OR gate interposed between the logic AND gate and the second set of look-up tables.

5. The programmable logic region defined in claim 3 wherein the logic circuitry comprises:
    a multiplexing circuit coupled to the first and second sets of look-up tables; and
    a logic OR gate interposed between the multiplexing circuit and the second set of look-up tables, wherein the logic OR gate is coupled to a control input of the multiplexing circuit.

6. The programmable logic region defined in claim 3 further comprising a delay element coupled to the logic circuitry, wherein the delay element forms a feedback path between the logic circuitry and the first set of look-up tables.

7. A programmable logic region on a programmable integrated circuit, said programmable logic region comprising:
    a first set of look-up tables operable to receive programmable logic region input signals for the programmable logic region;
    a second set of look-up tables operable to provide programmable logic region output signals for the programmable logic region; and
    multiplexer circuitry coupled between the first set of look-up tables and the second set of look-up tables, wherein the multiplexer circuitry is operable to receive output signals from at least two different look-up tables of the first set of look-up tables and is configured to route one of the output signals from the two different look-up tables to a given look-up table of the second set of look-up tables, and wherein the first set of look-up tables is further operable to provide additional programmable logic region output signals for the programmable logic region.

8. The programmable logic region defined in claim 7 wherein the multiplexer circuitry comprises a plurality of multiplexer circuits each operable to receive at least one input signal of the programmable logic region input signals in parallel with at least one output signal of the output signals from the first set of look-up tables.

9. The programmable logic region defined in claim 8 wherein each multiplexer circuit of the plurality of multiplexer circuits is coupled to a respective programmable memory element that is operable to produce a static output signal that configures that multiplexer circuit to route a selected signal from the at least one input signal of the programmable logic region input signals and the at least one of the output signals of that multiplexer to the second set of look-up tables.

10. A programmable logic region on a programmable integrated circuit, said programmable logic region comprising:
   a first set of look-up tables operable to receive programmable logic region input signals for the programmable logic region;
   a second set of look-up tables operable to provide programmable logic region output signals for the programmable logic region;
   multiplexer circuitry coupled between the first set of look-up tables and the second set of look-up tables, wherein the multiplexer circuitry is operable to receive output signals from at least two different look-up tables of the first set of look-up tables and is configured to route one of the output signals from the two different look-up tables to a given look-up table of the second set of look-up tables; and
   outputs operable to provide the programmable logic region output signals to interconnects on the programmable integrated circuit, wherein the interconnects are operable to route the programmable logic region output signals throughout the programmable integrated circuit.

11. A programmable logic region on a programmable integrated circuit, said programmable logic region comprising:
   a first set of look-up tables operable to receive programmable logic region input signals for the programmable logic region;
   a second set of look-up tables operable to provide programmable logic region output signals for the programmable logic region;
   multiplexer circuitry coupled between the first set of look-up tables and the second set of look-up tables, wherein the multiplexer circuitry is operable to receive output signals from at least two different look-up tables of the first set of look-up tables and is configured to route one of the output signals from the two different look-up tables to a given look-up table of the second set of look-up tables; and
   programmable elements operable to provide static output signals to the multiplexer circuitry that determines which output signal from the two different look-up tables is routed to the given look-up table of the second set of look-up tables.

12. The programmable logic region defined in claim 7 wherein at least one look-up table of the first set of look-up tables is operable to receive a carry input signal and to produce a first carry output signal and a first sum signal based at least partly on the carry input signal, the programmable logic region further comprising:
   a routing path between the at least one look-up table of the first set of look-up tables and the given look-up table of the second set of look-up tables, wherein the routing path bypasses the multiplexer circuitry and wherein the given look-up table of the second set of look-up tables is operable to receive the first carry output signal from the first set of look-up tables over the routing path and is further operable to produce a second carry output signal and a second sum signal based at least partly on the first carry output signal.

13. The programmable logic region defined in claim 7 wherein the second set of look-up tables is operable to receive at least one of the programmable logic region input signals.

14. A programmable logic region on a programmable integrated circuit, said programmable logic region comprising:
   a first look-up table circuit operable to produce a first output signal;
   a second look-up table circuit operable to produce a second output signal;
   logic circuitry operable to receive the first output signal and the second output signal, wherein the logic circuitry is further operable in a first configuration in which a programmable logic region output signal for the programmable logic region is generated based on the first and second output signals and in a second configuration in which the programmable logic region output signal is generated based on the first output signal;
   a first programmable logic region output operable to receive the programmable logic region output signal from the logic circuitry; and
   a second programmable logic region output operable to receive the second output signal from the second look-up table circuit.

15. The programmable logic region defined in claim 14 wherein the logic gate comprises:
   a logic OR gate operable to receive the second output signal and a static data output signal from a programmable element and to produce an intermediate signal based on the static data output signal and the second output signal.

16. The programmable logic region defined in claim 15 wherein the logic circuitry further comprises:
   a logic AND gate operable to receive the intermediate signal and the first output signal and to produce the programmable logic region output signal.

17. The programmable logic region defined in claim 15 wherein the logic circuitry further comprises:
   a multiplexing circuit operable to receive the first output signal and an additional static data output signal from an additional programmable element, wherein the multiplexing circuit is further operable to receive the intermediate signal and to select the programmable logic region output signal from the first output signal and the additional static data output signal based on the intermediate signal.

18. The programmable logic region defined in claim 14 further comprising:
   a delay element operable to receive the programmable logic region output signal and provide a delayed output signal to the look-up table circuitry, wherein the look-up table circuitry is configured to generate the programmable logic region output signal based on the delayed output signal.

19. The programmable logic region defined in claim 14 wherein the logic circuitry further comprises:
   a logic gate operable to receive the second output signal at a first data input and further operable to receive a static data output signal from a programmable element at a second data input, wherein the logic gate is further operable to produce an intermediate signal based on the static data output signal and the second output signal.

* * * * *